(12) United States Patent
Estacio et al.

(10) Patent No.: US 11,621,203 B2
(45) Date of Patent: Apr. 4, 2023

(54) SIC MOSFET SEMICONDUCTOR PACKAGES AND RELATED METHODS

(71) Applicant: SEMICONDUCTOR COMPONENTS INDUSTRIES, LLC, Phoenix, AZ (US)

(72) Inventors: Maria Cristina Estacio, Lapulapu (PH); Jerome Teysseyre, Scottsdale, AZ (US); Elsie Agdon Cabahug, Consolacion (PH)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 228 days.

(21) Appl. No.: 16/539,319

(22) Filed: Aug. 13, 2019

(65) Prior Publication Data

US 2020/0098870 A1    Mar. 26, 2020

Related U.S. Application Data

(60) Provisional application No. 62/733,793, filed on Sep. 20, 2018.

(51) Int. Cl.
*H01L 23/31* (2006.01)
*H01L 29/16* (2006.01)
(Continued)

(52) U.S. Cl.
CPC ........ *H01L 23/3107* (2013.01); *H01L 21/565* (2013.01); *H01L 23/367* (2013.01);
(Continued)

(58) Field of Classification Search
CPC ............. H01L 21/565; H01L 23/49524; H01L 23/49582; H01L 23/3107; H01L 2224/02379; H01L 24/33; H01L 24/97; H01L 24/32; H01L 24/73; H01L 24/40; H01L 2224/06181; H01L 2224/40247; H01L 2224/96; H01L 2224/97; H01L 2224/28105; H01L 2224/04105;
(Continued)

(56) References Cited

U.S. PATENT DOCUMENTS 6,982,193 B2 *  1/2006  Hossain ............. H01L 29/0634
                                                            438/135
7,256,501 B2     8/2007  Okamoto et al.
(Continued)

OTHER PUBLICATIONS

NXP Freescale, Freescale's Redistributed Chip Packaging (RCP), Jan. 2013, 21 pages.
(Continued)

*Primary Examiner* — Shahed Ahmed
*Assistant Examiner* — Sun Mi Kim King
(74) *Attorney, Agent, or Firm* — Adam R. Stephenson, Ltd.

(57) ABSTRACT

A semiconductor package is disclosed. Specific implementations of a semiconductor package may include: one or more semiconductor die coupled between a baseframe and a clip, the baseframe including a gate pad of the baseframe coupled with a gate pad of the one or more semiconductor die, and a source pad of the baseframe coupled with a source pad of the one or more semiconductor die, where the gate pad of the baseframe extends beyond a perimeter of the one or more semiconductor die.

20 Claims, 16 Drawing Sheets

(51) Int. Cl.
*H01L 23/00* (2006.01)
*H01L 21/56* (2006.01)
*H01L 23/367* (2006.01)
*H01L 23/495* (2006.01)

(52) U.S. Cl.
CPC .. *H01L 23/49524* (2013.01); *H01L 23/49582* (2013.01); *H01L 24/09* (2013.01); *H01L 29/1608* (2013.01); *H01L 2224/02379* (2013.01)

(58) Field of Classification Search
CPC ..... H01L 23/49575; H01L 2221/68331; H01L 23/482; H01L 23/49503; H01L 23/4951
See application file for complete search history.

(56) References Cited

U.S. PATENT DOCUMENTS

| | | | | |
|---|---|---|---|---|
| 7,394,146 | B2 * | 7/2008 | Kajiwara | H01L 24/81 257/672 |
| 8,669,140 | B1 | 3/2014 | Muniandy et al. | |
| 9,006,873 | B2 | 4/2015 | Nikitin et al. | |
| 9,040,346 | B2 | 5/2015 | Nikitin et al. | |
| 9,196,577 | B2 * | 11/2015 | Otremba | H01L 24/17 |
| 9,640,497 | B1 | 5/2017 | Lin et al. | |
| 2009/0236749 | A1 | 9/2009 | Otremba et al. | |
| 2010/0193921 | A1 * | 8/2010 | Jereza | H01L 24/36 257/676 |
| 2011/0156250 | A1 | 6/2011 | Goh et al. | |
| 2015/0194373 | A1 * | 7/2015 | Otremba | H01L 23/4952 257/676 |
| 2017/0372987 | A1 * | 12/2017 | Xue | H01L 24/73 |
| 2019/0181116 | A1 | 6/2019 | Lin | |

OTHER PUBLICATIONS

STATSChipPAC, eWLB (FoWLP Technology), Jun. 2017, 2 pages.
Mouawad, et al., Low Parasitic Inductance Multi-chip SiC Devices Packaging Technology, 18th European Conference on Power Electronics and Applications, Sep. 5-9, 2016, 8 pages, Karlsruhe, Germany.
Seal, et al., High Performance Silicon Carbide Power Packaging—Past Trends, Present Practices, and Future Directions, Energies, 2017, 30 pages, vol. 10, No. 341.
Lapedus, M., 5 Takeaways from ISS 2018, Semiconductor Engineering, Feb. 14, 2018, 8 pages.

* cited by examiner

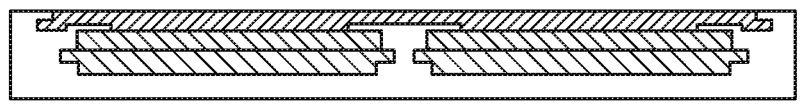
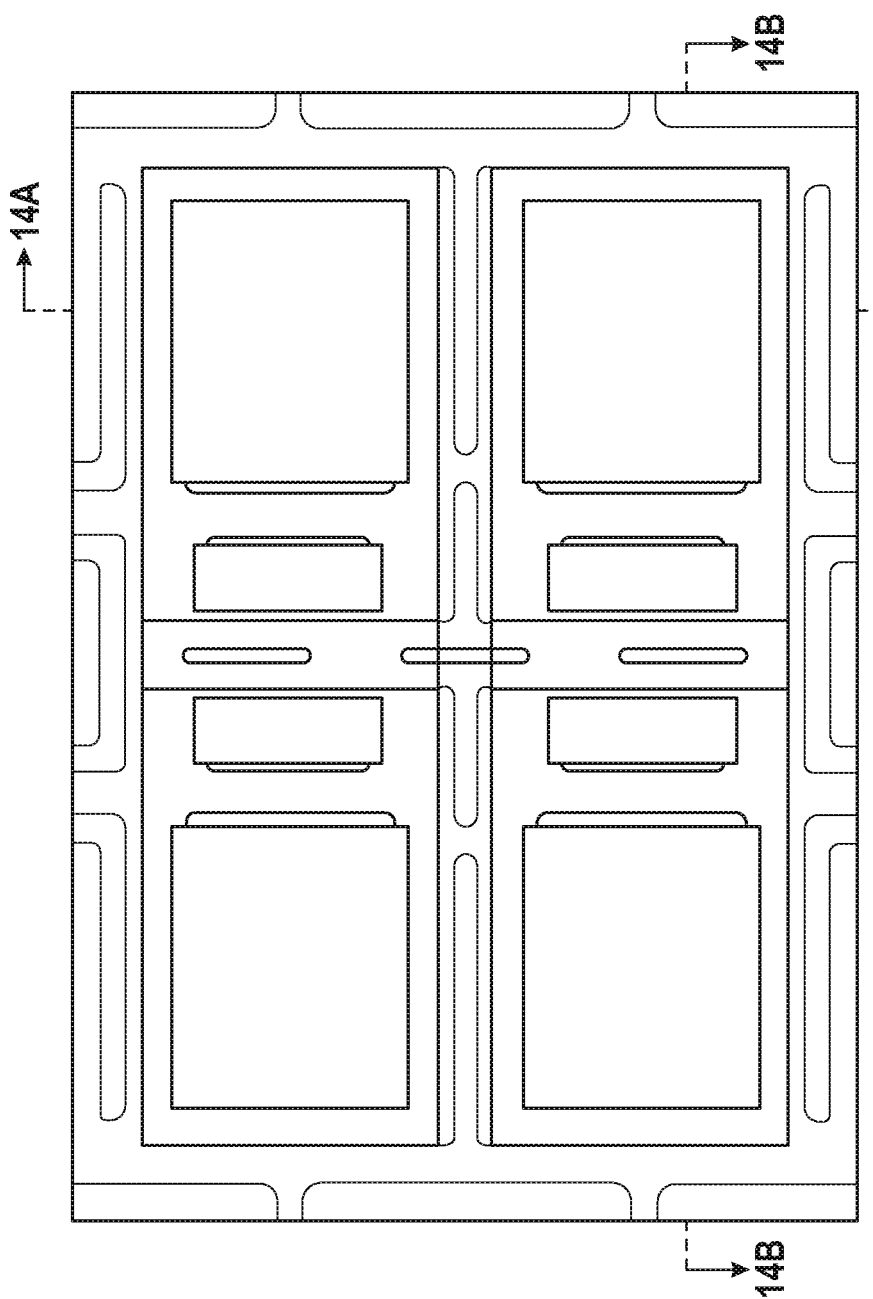
FIG. 14B
FIG. 14
FIG. 14A

SIC MOSFET SEMICONDUCTOR PACKAGES AND RELATED METHODS

CROSS REFERENCE TO RELATED APPLICATIONS

This document claims the benefit of the filing date of U.S. Provisional Patent Application 62/733,793, entitled "SiC MOSFET Semiconductor Packages and Related Methods" to Estacio et al. which was filed on Sep. 20, 2018, the disclosure of which is hereby incorporated entirely herein by reference.

BACKGROUND

1. Technical Field

Aspects of this document relate generally to systems and methods for packaging semiconductor devices. More specific implementations also include packages for silicon carbide semiconductor devices.

2. Background

Semiconductor devices are enclosed in a package to enable electrical and mechanical connections with a circuit board or other electronic devices coupled to the package.

SUMMARY

Implementations of a semiconductor package may include: one or more semiconductor die coupled between a baseframe and a clip, the baseframe including a gate pad of the baseframe coupled with a gate pad of the one or more semiconductor die, and a source pad of the baseframe coupled with a source pad of the one or more semiconductor die, where the gate pad of the baseframe extends beyond a perimeter of the one or more semiconductor die.

Implementations of semiconductor packages may include one, all, or any of the following:

An Ag sinter layer may be coupled between the one or more semiconductor die, the clip and the baseframe.

The clip may include a drain pad and the clip couples with a drain pad of the one or more semiconductor die.

A mold compound may enclose the one or more semiconductor die on four sides of a die of the one or more semiconductor die.

A redistribution layer may be included between the gate pad of the one or more semiconductor die and the gate pad of the baseframe.

A heat sink may be coupled directly to the one or more semiconductor die through a die adhesive material.

The package may be configured to provide electrical isolation between a termination ring of the one or more semiconductor die and the source pad of the one or more semiconductor die over an operating voltage range of 400 V to 1700 V.

Implementations of a semiconductor package may include: one or more semiconductor die coupled between a baseframe and a heat sink, the baseframe including a gate pad of the baseframe coupled with a gate pad of the one or more semiconductor die, and a source pad of the baseframe coupled with a source pad of the one or more semiconductor die, wherein the gate pad of the baseframe extends beyond a perimeter of the one or more semiconductor die.

Implementations of semiconductor packages may include one, all, or any of the following:

An Ag sinter layer may be coupled between the one or more semiconductor die, the heat sink, and the baseframe.

The heat sink may include a drain pad and the heat sink couples with a drain pad of the one or more semiconductor die.

A mold compound may enclose the one or more semiconductor die on four sides of a die of the one or more semiconductor die.

A redistribution layer may be included between the gate pad of the one or more semiconductor die and the gate pad of the baseframe.

Implementations of a method of forming a semiconductor package may include: providing a baseframe, providing two or more semiconductor die each coupled with a heat sink or a clip, the two or more semiconductor die coupled together through a wafer carrier, coupling an Ag sinter material on one or more gate pads and one or more source pads of the baseframe, pressure sintering one or more gate pads and one or more source pads of one or more semiconductor die with the Ag sinter material, molding a mold compound over the baseframe and the two or more semiconductor die, and grinding away the wafer carrier to expose the heat sink or the clip, the heat sink or the clip each comprising a drain contact.

Implementations of a method of forming semiconductor packages may include one, all, or any of the following:

The method may include after pressure sintering, coupling the two or more semiconductor die to the clip.

The method may include coupling the clip to the baseframe.

The gate pad of the baseframe may extend beyond a perimeter of the two or more semiconductor die.

The two or more semiconductor die may have all four sides of each of the two or more semiconductor die encapsulated by the mold compound.

The method may include including the package in an automotive high power module (AHPM) module.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 14 illustrates an internal structure of the package as shown in FIG. 13 with FIGS. 14A and 14B being cross sectional views along the indicated sectional lines;

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

A wide variety of semiconductor devices are made from a wide variety of semiconductor substrates. In this document, a fan-out package design for a metal oxide field effect transistor (MOSFET) device manufactured on a silicon carbide semiconductor substrate is disclosed. While the structures illustrated in this solution are particular to the MOSFET design disclosed in this document, the principles disclosed herein may be applied to other semiconductor device types (rectifiers, insulated-gate bipolar transistors [IGBTs], bipolar junction transistors, etc.) formed on any of a wide variety of semiconductor substrate types, such as, by non-limiting example, single crystal silicon, polysilicon, glass, silicon-on-insulator, gallium arsenide, sapphire, ruby, or any other semiconductor substrate type.

Figure 1:
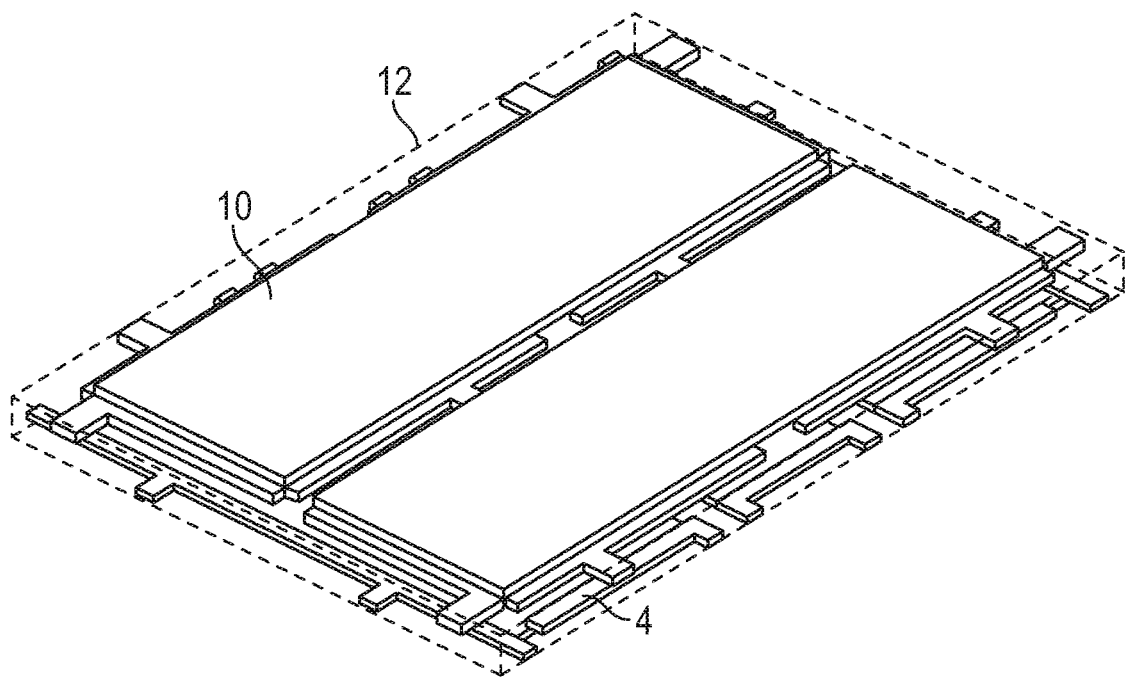
FIG. 1 illustrates an exploded view of a first package implementations including a top (live-bug) view and a bottom (dead-bug) view.
Figure 1:
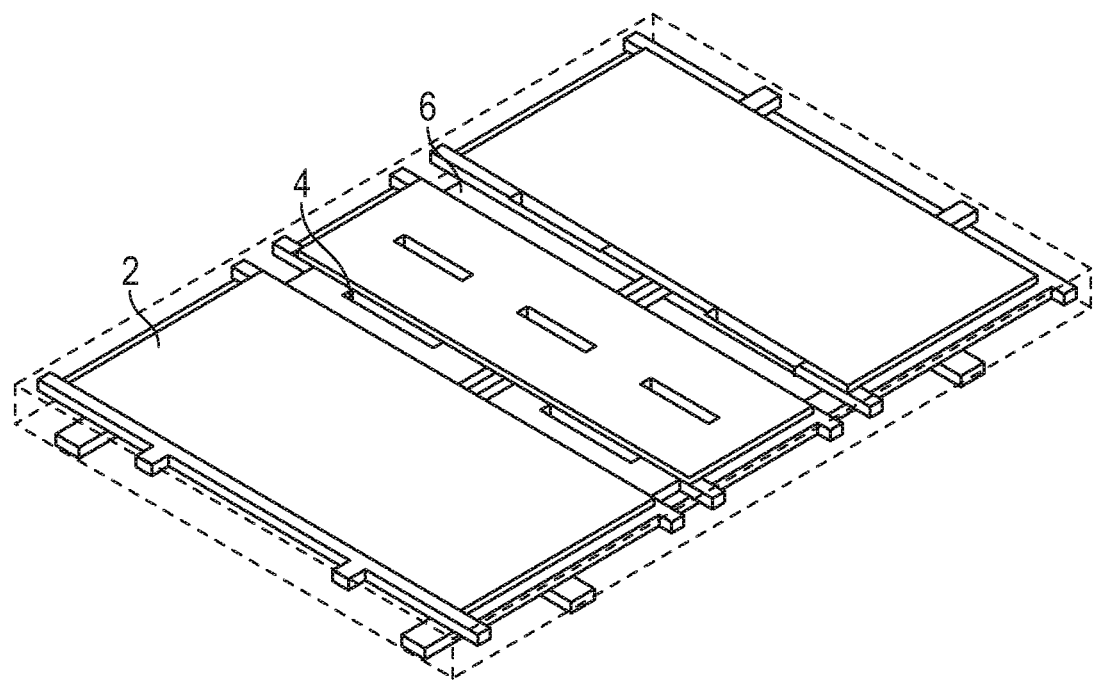

Referring to FIG. 1, an exploded view of a first package implementation including a top (live-bug) view and a bottom (dead-bug) view are illustrated. As illustrated, the base of the package design includes a metal baseframe 2. In various implementations, this baseframe 2 may be made of copper with Ag plating on the contact pads designed to interact with/bond with the circuit board to which the package will be coupled. In various implementations the baseframe 2 may be etched, such as, by non-limiting example, half etched or etched to another desired portion of the baseframe thickness. As illustrated, on the various die support portions, a layer of Ag sinter material 4 is placed. In various implementations, the Ag sinter material 4 may be 30 microns thick, though the material may be more or less thick in various implementations. In the package illustrated, four SiC MOSFET devices 6 are each separately placed over the Ag sinter material 4 which acts as an interconnect and bonding material to the baseframe 2. As illustrated, the SiC MOSFET devices 6 are flipped from the side on which the devices were fabricated to a backmetal side of the die (flip chip). Additional Ag sinter material 4 is coupled over the backmetal of each die.

As illustrated, a metal clip 10 is coupled to the Ag sinter material 4 and the SIC MOSFET devices 6. In various implementations, the clip 10 is bare copper with Ag plating on contact pads and may be etched to various thicknesses like any disclosed herein in various implementations. A mold compound 12 (indicated in dotted lines in this see-through view) is used to cover the clip 10 and the baseframe 2. Since the SiC MOSFET devices 6 are coupled between the baseframe 2 and the clip 10, they are also fully enclosed by the mold compound 12 (see the unexploded top view and bottom view). In various implementations, as illustrated, all four sides of the SiC MOSFET die 6 are encapsulated by the mold compound 12 which may minimize die corner stresses and exposed silicon drain metallization.

Figure 2:
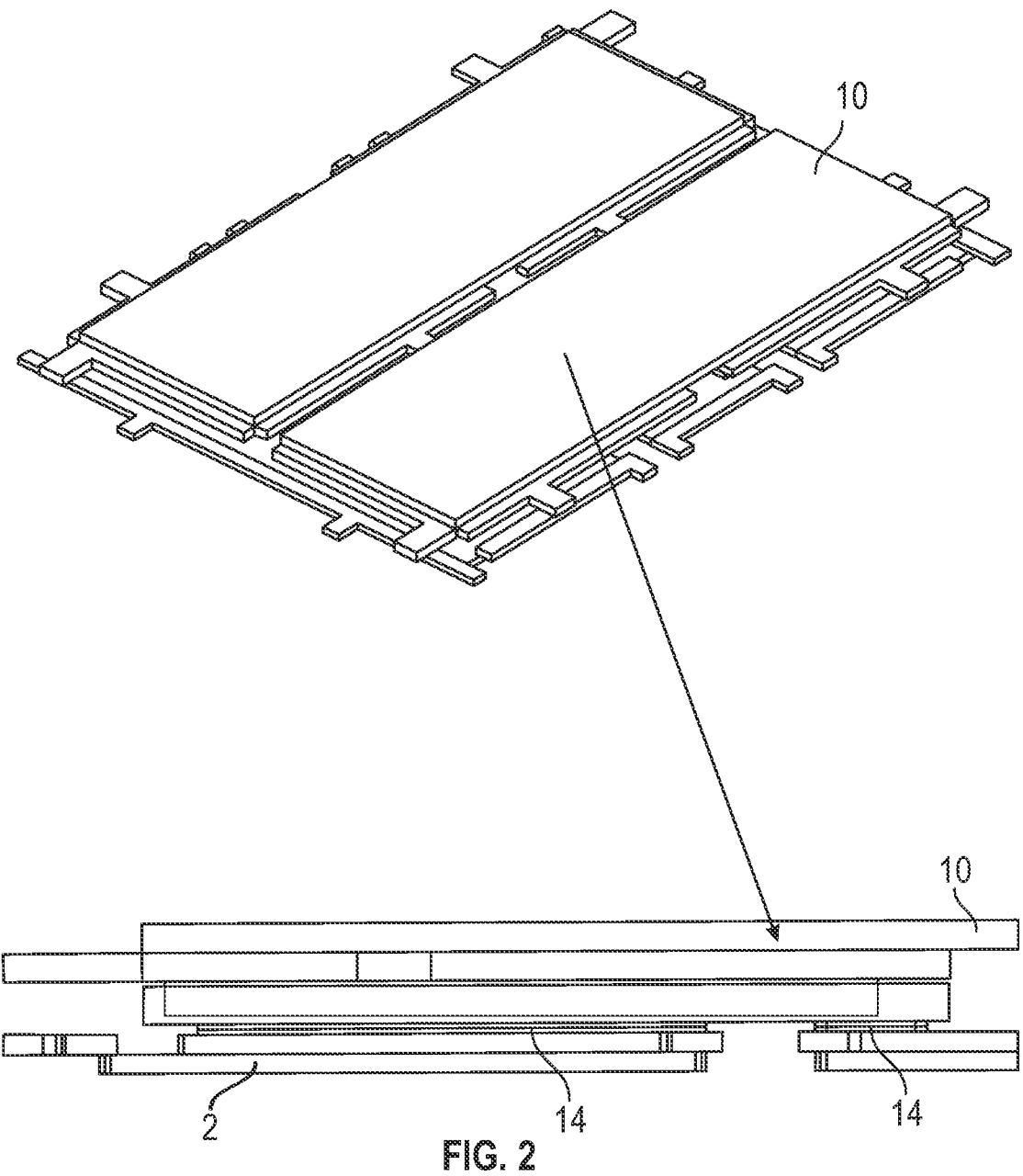
FIG. 2 illustrates a top perspective view and a side partial see-through view of the package of FIG. 1.
Figure 3:
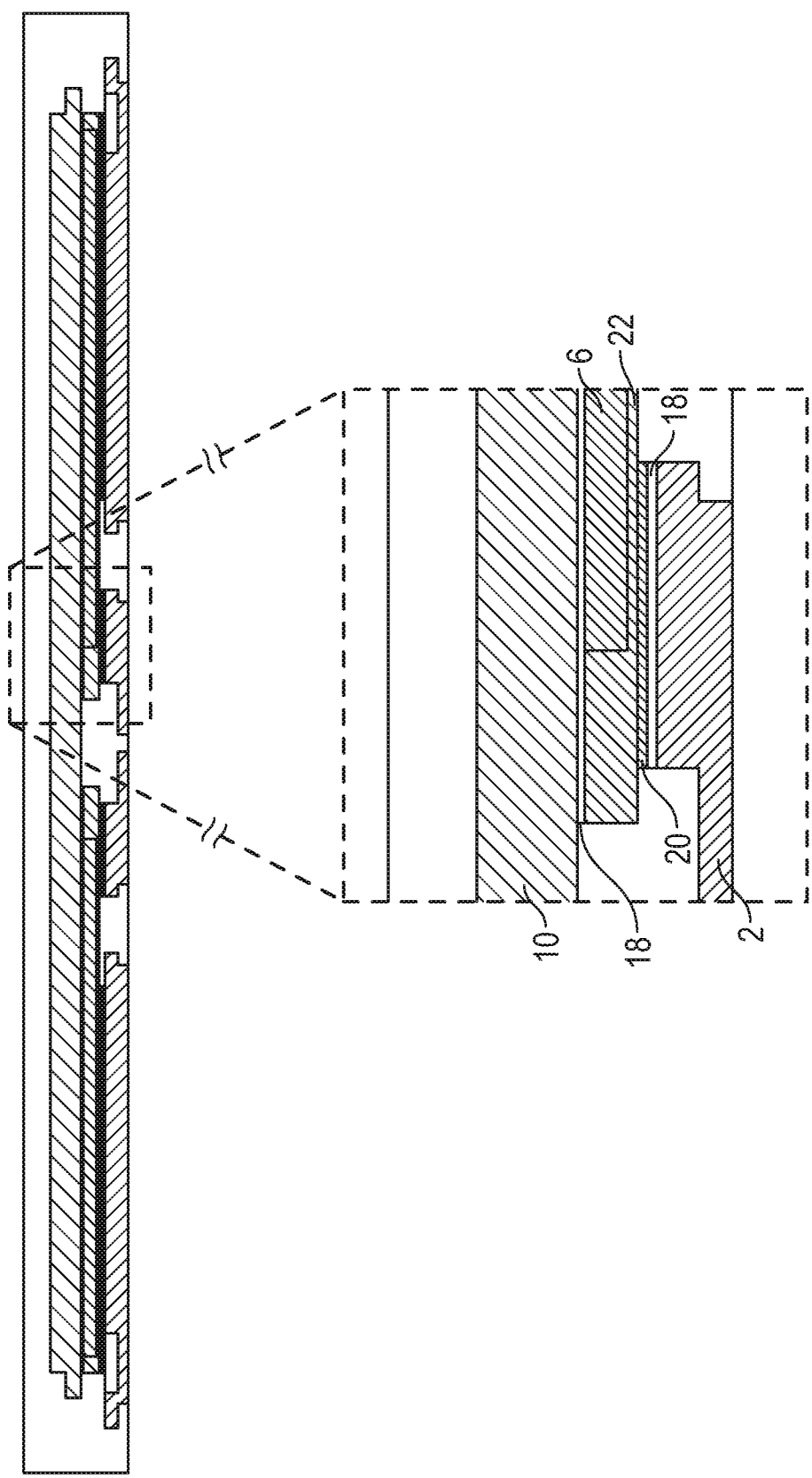
FIG. 3 illustrates a package design where two SiC MOSFETs are coupled with gate sides facing one another.

Referring to FIG. 2, a top perspective view and a side partial see-through view of the package of FIG. 1 is illustrated. As illustrated, the shape of the side of the clip 10 and the side of the baseframe 2 include various portions that are designed to become contacts 14 that extend outside the perimeter of the various SiC MOSFET die, allowing the package to couple to a motherboard or circuit board. Because the contacts 14 are outside the perimeter of the die, the package design can be referred to as a "fan-out" package design. FIG. 3 illustrates a package design where two SiC MOSFETs 6 are coupled with gate sides facing one another. The structure of the gate contacts in the package are illustrated, showing the various layers that are coupled between the baseframe 2 (interface layer 18, STM layer 20, and the internal redistribution layer 22). Note how the perimeter of the material of the baseframe 2 forms a contact that extends beyond the perimeter of the SiC die 6, fanning out the contact away from the physical location of the actual gate contact location of the SiC die. FIG. 3 also illustrates how the clip 10 covers the entire surface of the SiC MOSFET die 6.

Figure 4:
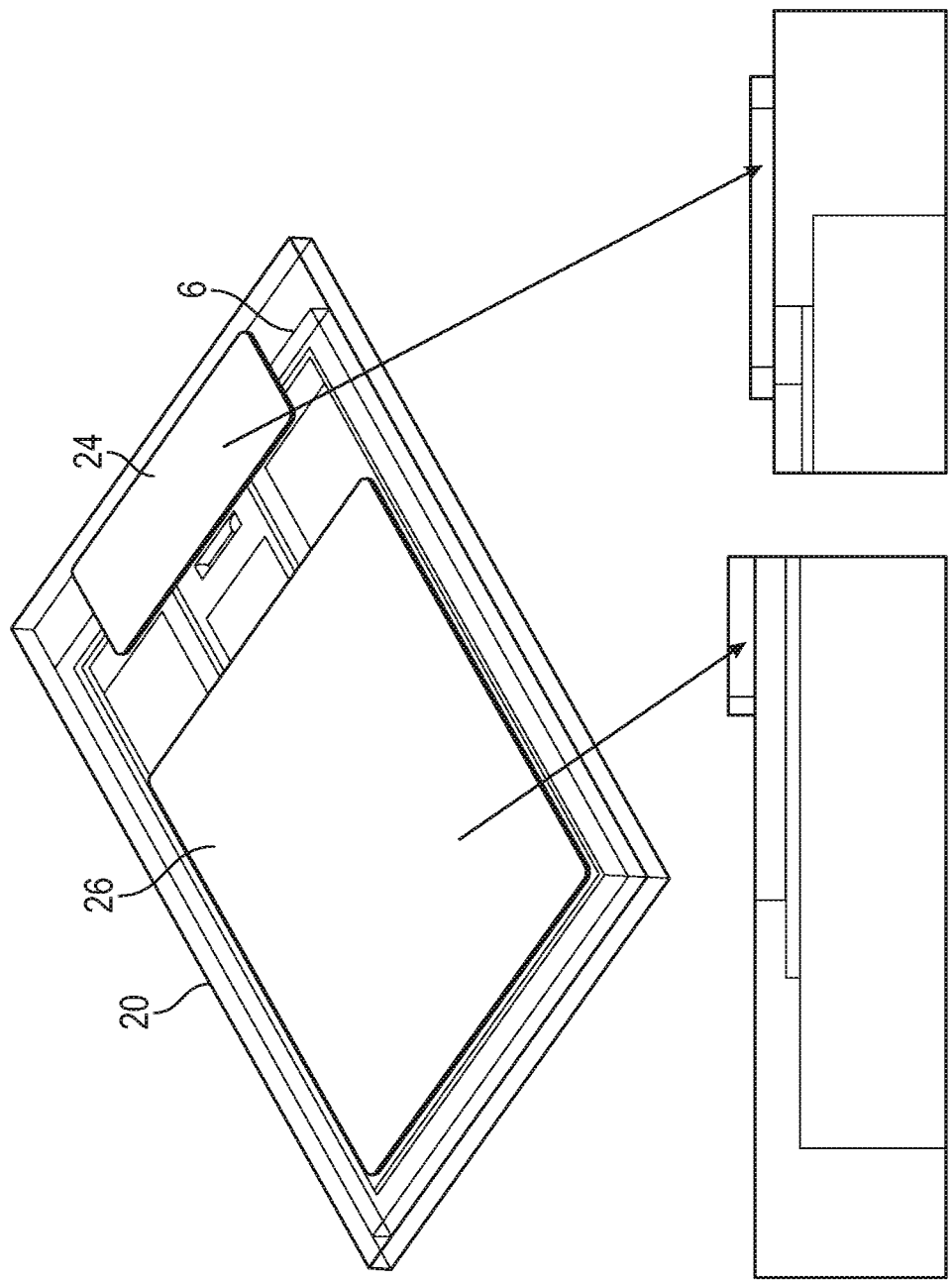
FIG. 4 illustrates a top perspective view of a side view of a redistribution layer (RDL) formed through the combination of the internal RDL and the structure of a baseframe.

A particular design of the redistribution layer formed through the combination of the internal RDL and the structure of the baseframe 2 is illustrated in FIG. 4. In various implementations, because the dimensions of the gate contact 24 in particular are much larger than the physical dimensions of the gate contact on the SiC die itself, the gate contact 24 "fans out" the gate contact of the SiC die to a larger area. Also, because a single large contact pad 26 is used to couple with the three source pads of the SiC die, the size of the source pad 26 can be maximized. This approach of maximizing the size of the gate contact 24 is contrary to those design methods which are designed to have a gate pad that occupies the least area in the package so that the source active area of the SiC MOSFET device can be maximized. In such implementations, while maximizing the size of the source contact 26 in the package enables lower resistance performance for the device and works to minimize hot spots, design rules specify that a minimum distance between the source pad 26 and the gate pad 24 must be present. Some leadframe designs do not allow the SiC MOSFET to achieve this minimum separation (300 um in some implementations). However, because of the use of the fan-out technique for the gate pad 24, the size of the source pad 26 can be increased as the material of the gate pad 24 extends over the perimeter of the die 6 into the region covered by the mold compound 12. In this way, the minimum separation can be achieved and the size of the source pad 26 maximized in a leadframe design.

Figure 5:
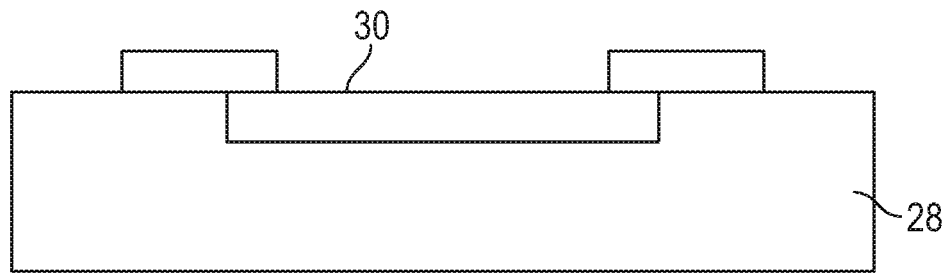
FIG. 5 illustrates a pad structure where the height of a polyimide passivation causes a polyimide to create a gap preventing pressure sintering between Ag sinter material and the material of the pad.
Figure 6:
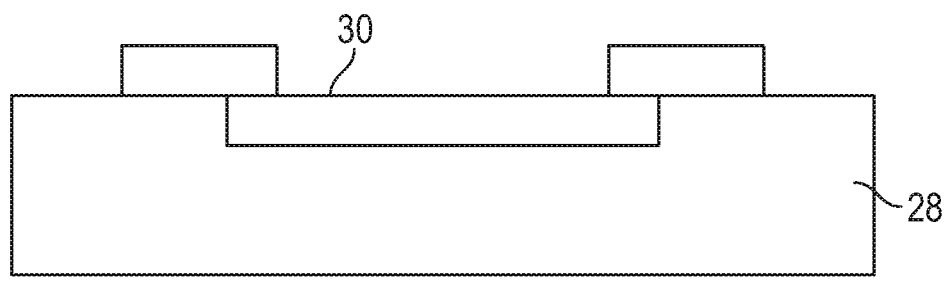
FIG. 6 illustrates a pad structure where the height of the polyimide passivation causes a Cu pad material to create a gap preventing pressure sintering between Ag sinter material and the material of the pad.

One of the reasons for using a larger gate contact size is that the design rules for using various implementations of Ag pressure sintering materials require that any contact used in the process needs to be at least 1 mm×1 mm in size. Where the gate contact on the die is not at least this size, attempting to use a 1 mm×1 mm sized Ag sinter material to overlap the smaller contact will cause an elevated risk of STM peeling due to the topography of the polyimide passivation (up to about a 5 micron to about 18 micron or thicker layer in various implementations). FIGS. 5 and 6 show two different pad structures where the height of the polyimide (PI) passivation 28 causes either polyimide itself (FIG. 5) or the Cu pad material 30 (FIG. 6) to create a gap preventing pressure sintering between the Ag sinter material and the material of the pad itself.

Figure 7A:
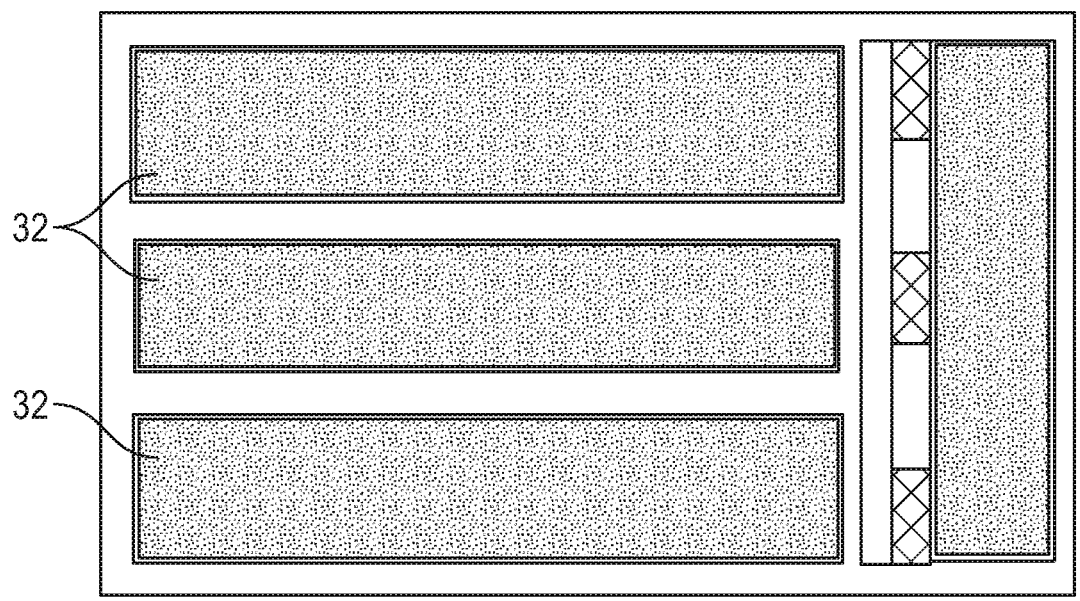
FIG. 7A illustrates three separate layers of Ag sinter applied directly over each source contact of an SiC device.
Figure 7B:
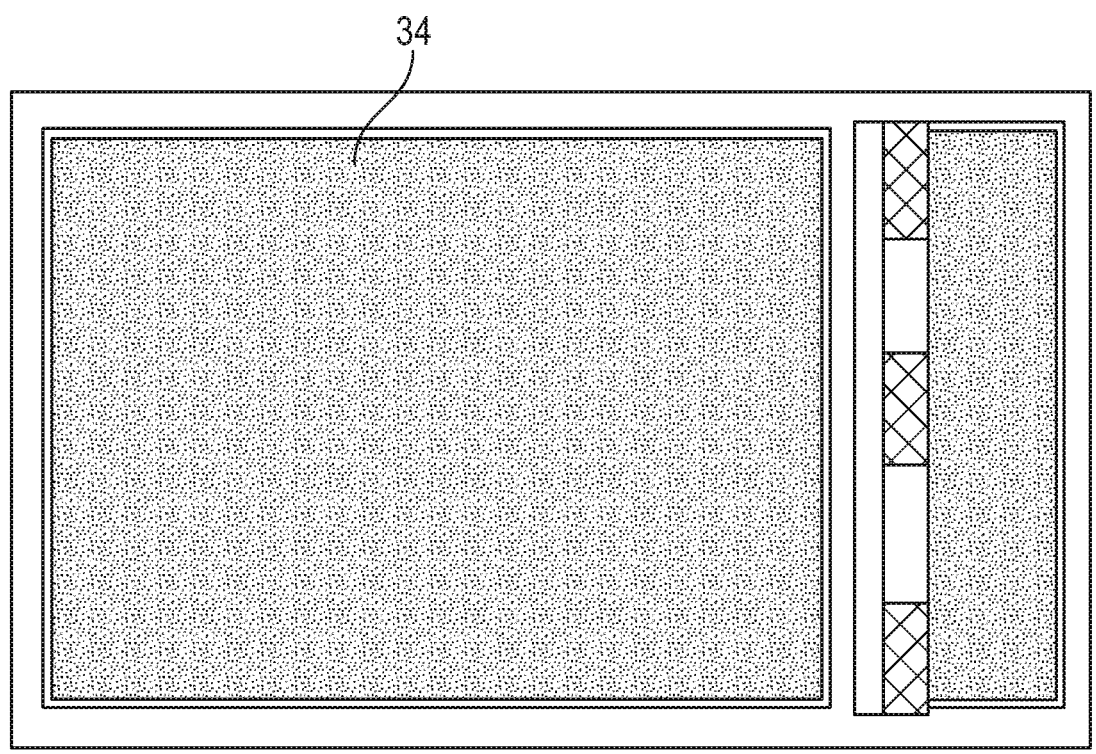
FIG. 7B illustrates a single layer of Ag sinter applied directly over all source contacts of an SiC device.
Figure 8:
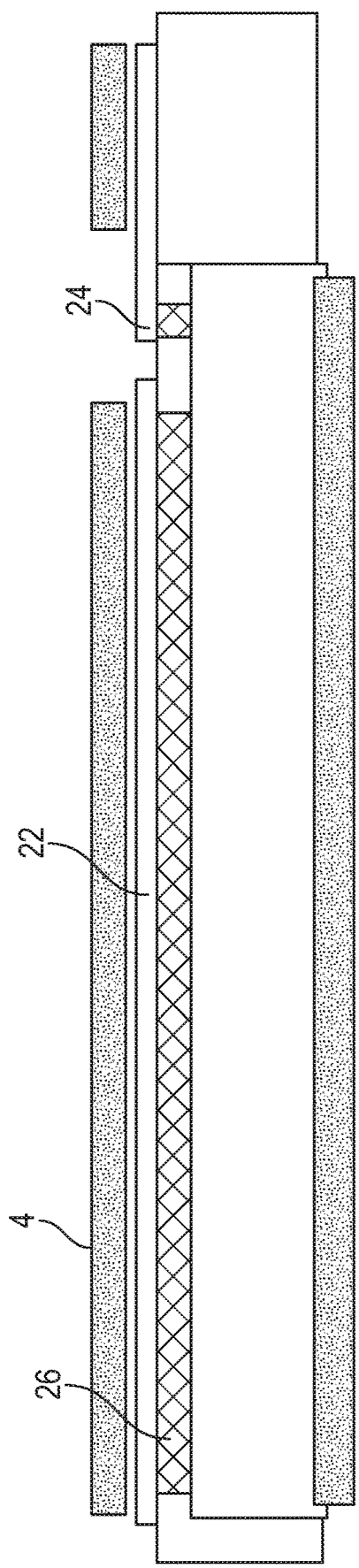
FIG. 8 illustrates a side view of FIGS. 7A and 7B.

The new contact designs disclosed herein permit application of Ag sinter materials in either of two patterns, the pattern in FIG. 7A where three separate layers 32 are applied directly over each source contact of the SiC device or the pattern in FIG. 7B where a single large layer 34 is applied over all three source contacts of the SiC device. Because the gate contact in the package is able to fan out beyond the die perimeter itself, the redistribution layer coupled over the gate contact permits the source contact to, in some implementations, extend over the perimeter of the gate contact of the SiC die, thus maximizing the size of the source contact of the package. In various implementations, the use of the redistribution layer also eliminates the need for the Ag sinter material to be applied directly to the gate contact of the SiC die itself, meaning that the Ag sinter material can be applied only over the fully planar surface of the redistribution layer, eliminating the issues with the height of the polyimide passivation material around the gate contact of the SiC die, while still allowing Ag sintering to be employed. FIG. 8 is a side view of either of the structures of FIG. 7A or 7B illustrating the height of the Ag sinter material 4, the location of the redistribution layer 22, the source contacts 26, and the gate contacts 24 of the SiC device itself, showing the fan-out effect of the gate pad 24 of the package.

In various implementations, the use of the new fan-out contact designs disclosed herein may permit the use of gate pad sizes from about 0.1 mm×0.1 mm to about 2 mm×2 mm. The gate pad size range permits the gate pad's size to be selected based on the device characteristics and reduces the need for the pad size to be controlled by process design rule requirements.

The thickness and type of mold compound between the die isolation ring or termination ring and the RDL in the package or the metal source contact in the package may be selected, in various implementations, to provide sufficient electrical isolation for operating voltages from about 400 V to about 1700 V. In addition to operating voltage considerations, the thickness and type of mold compound will also vary depending on the type of semiconductor device being packaged (IGBT, SiC MOSFET, etc.)

Figure 9:
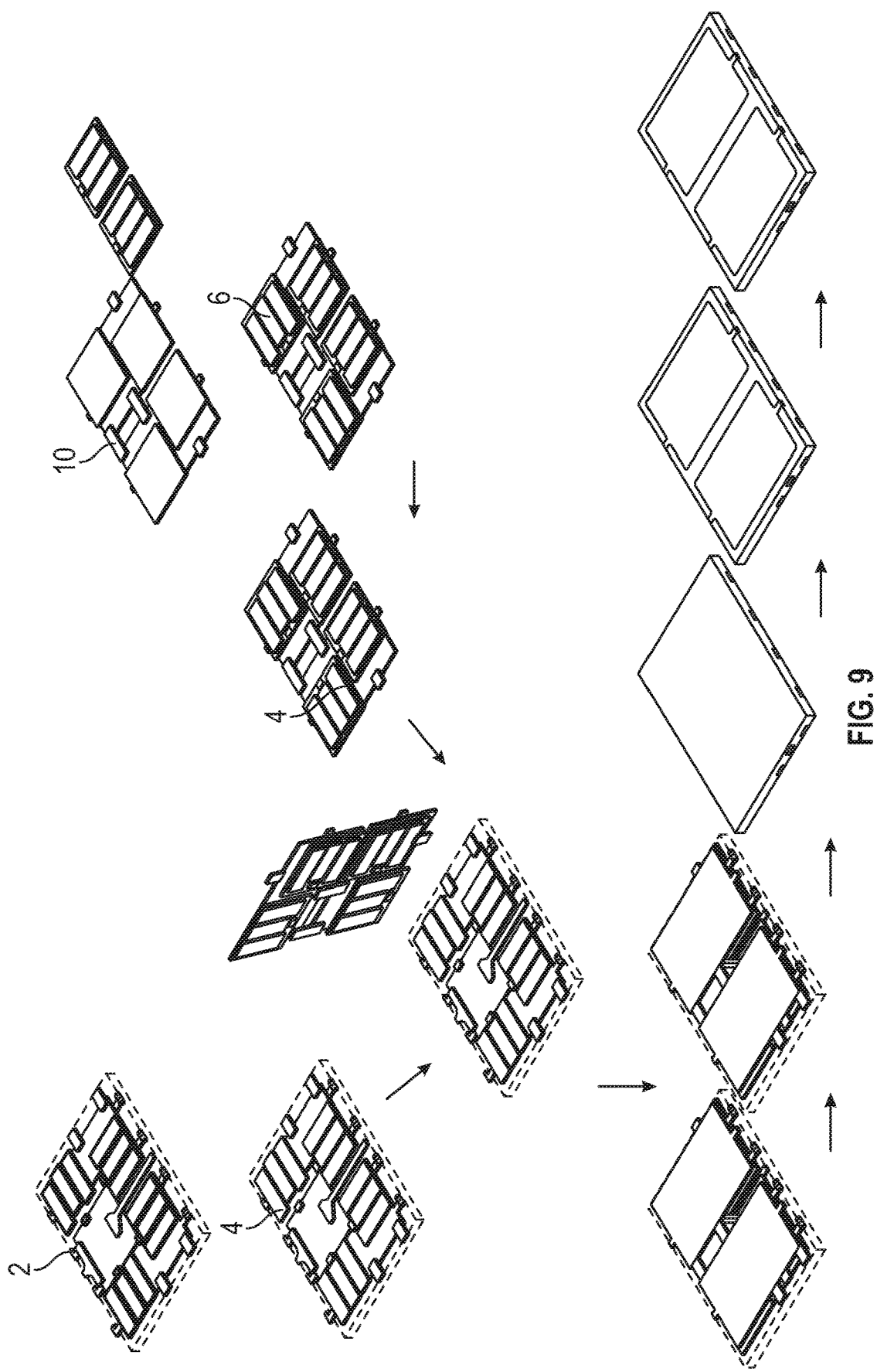
FIG. 9 illustrates an implementation of a method of forming a semiconductor package, like the package illustrated in FIG. 1.

Referring to FIG. 9, an implementation of a method of forming a semiconductor package like the package illustrated in FIG. 1 is illustrated. As illustrated, on the left, processing of the baseframe 2 begins by application of Ag sintering film 8 onto the leadframe pads designed to couple to the SiC die 6 (film transfer on baseframe step). On the right, the process of processing the clip 10 is illustrated, where the SiC die 6 are each individually coupled to the clip portions of the clip 10 with a die attach material and then the Ag sinter 8 is applied and a pressured sintering process is used to bond the Ag sinter 8 to the gate pad and source pads of the SiC die. As illustrated, the clip 10 is then flipped (flipping the die as well), and the Ag sinter material 4 on the baseframe 2 is coupled with the SiC die 6. A pressurized Ag sintering process is then used to bond the Ag sinter material 4 with the SiC die 6. In some implementations, following the pressurized Ag sintering process, a solvent wash process may be used to remove any residues followed by a plasma clean. A die molding process is then carried out, via any of a wide variety of molding techniques, including, by non-limiting example, transfer molding, compression molding, injection molding, and the like. A post mold cure (PMC) molding process is then used to finish curing the molded material covering the clip 10 and the baseframe 2. Following the PMC molding process, the package is then ground to expose the upper surfaces of the clip 10. In various implementations, the baseframe-side of the package may also be ground to expose the contacts and/or heat sink (as will be disclosed in more detail hereafter). Following the grinding of the package, a singulation process is carried out to separate the various packages from each other (as this process is carried out on two or more leadframes at a time). The singulation process may be, by non-limiting example, a sawing process, a laser process, a jet ablation process, or a plasma etching process.

Figure 10:
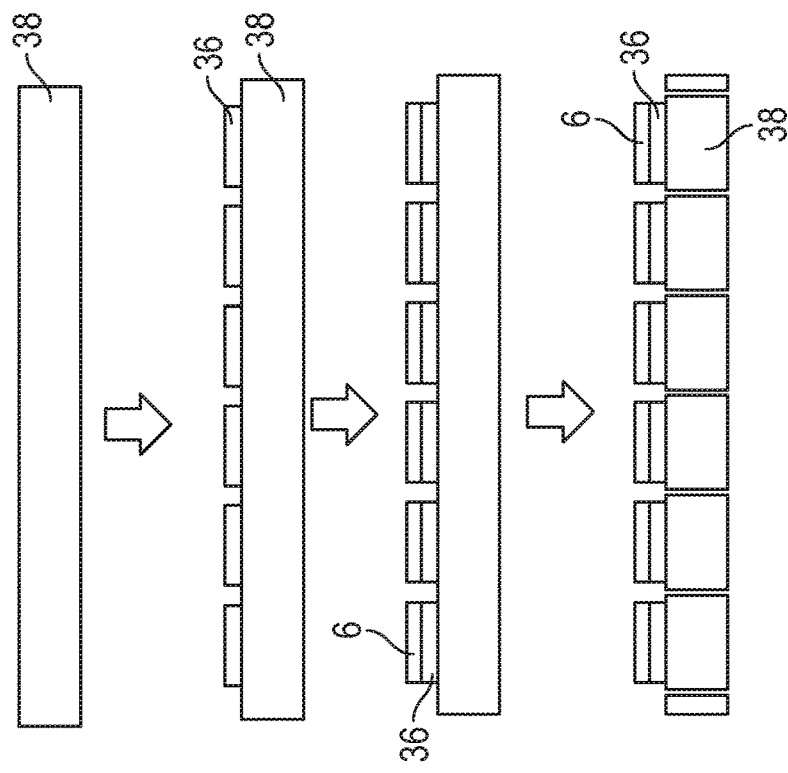
FIG. 10 illustrates a top view of a single SiC MOSFET die and a side view of a Cu heat sink coupled to a backside of the die via a pressure-assisted Ag sinter material, and illustrates an implementation of a method of coupling a heat sink with a SiC die.
Figure 10:
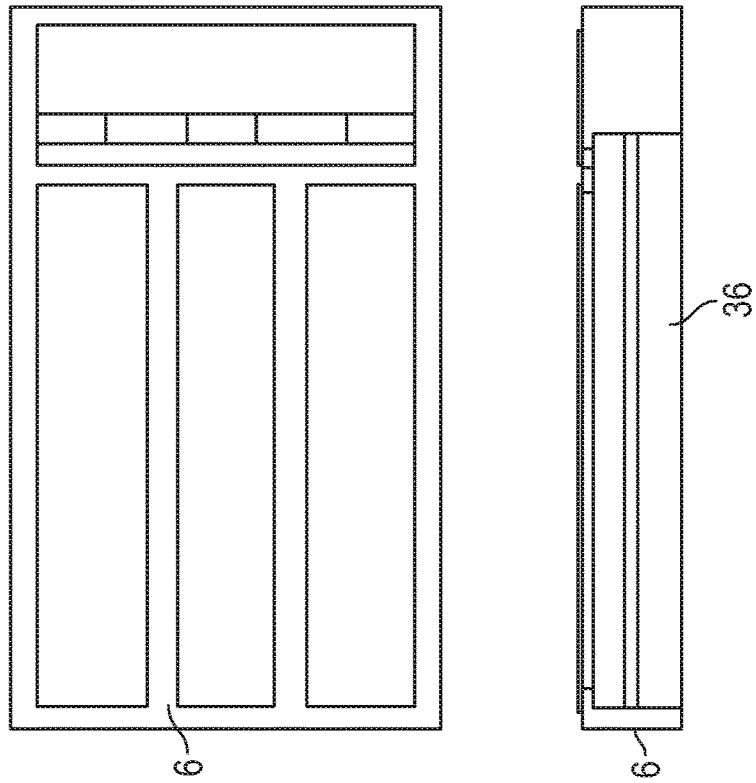

In various package implementations, cooling of the SiC MOSFET die may be carried out using a heat sink directly coupled with each die. FIG. 10 illustrates on the right a top view of a single SiC MOSFET die 6 and a side view illustrating a copper heat sink 36 (slug) coupled on the die 6 backside via a pressure-assisted Ag sinter material like those disclosed in this document. Other materials could be used to couple the heat sink 36 with the die, such as, by non-limiting example, a non-conductive tacky adhesive, die attach film, an electrically conductive epoxy, a metal, a metal alloy, or any other material capable of bonding the die to the heat sink material. In various implementations, the heat sink 36 may have a thickness between about 100 microns to about 500 microns depending on the thermal performance needed.

The process flow on the right of FIG. 10 illustrates an implementation of a method of coupling a heat sink with a SiC die. As illustrated, a wafer carrier 38 is provided which may be made of, by non-limiting example, a semiconductor substrate, glass, a metal, polymeric material, composite or other material capable of supporting the die and heat sinks. Each heat sink 36 is then coupled at a predetermined location on the wafer carrier 38 with an adhesive material, which may be a non-electrically conductive tacky adhesive in some implementations. Each SiC die 6 is then coupled over each heat sink 36 using any of the aforementioned die bonding materials. The wafer carrier 38 is then singulated to separate the heat sinks 36 and die 6 from one another. At this point, the combined SiC die/heat sink/wafer carrier may be processed through the various processing steps to couple the die 6 with the baseframe 2 and clip 10, and an additional grinding step added to remove the material of the wafer carrier from the heat sink. In some implementations, a grinding step may take place prior to processing with the clip 10 and the baseframe 2 to remove the wafer carrier material from the heat sink.

Figure 11:
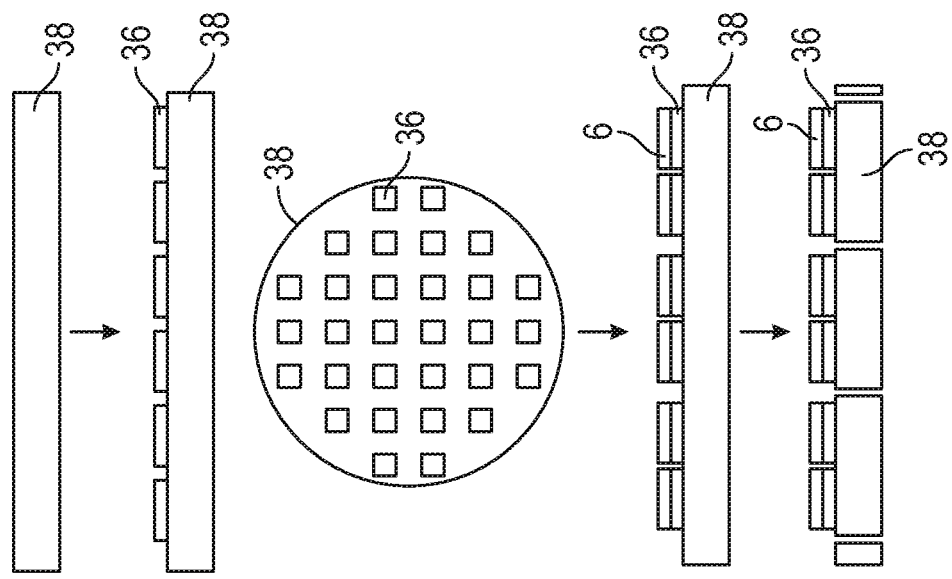
FIG. 11 illustrates a process flow of an implementation of a method of coupling a SiC die with a heat sink.
Figure 11:
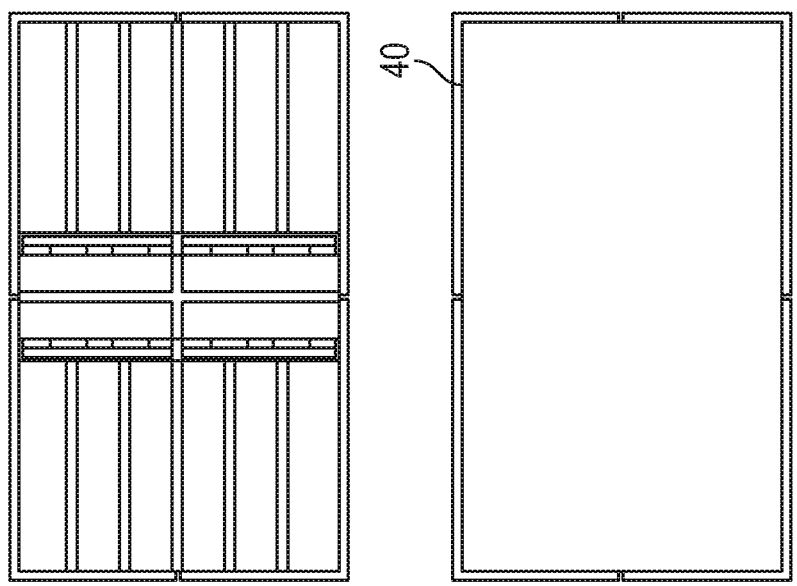

FIG. 10 illustrates a process where a single heat sink is paired with a single SiC die. This implementation forms a die that can be processed using the leadframe process illustrated in FIG. 9. In other package implementations, however, a method of coupling a SiC die with a heat sink may permit multiple SiC die to be processed simultaneously and assembled in parallel through the package formation step. On the right, referring to FIG. 11, a process flow of an implementation of the method is illustrated. A wafer carrier 38 is provided (which may be any disclosed in this document) on which each heat sink 36 (in this case copper slugs) are then mounted at predetermined locations using an adhesive (like a non-conductive tacky adhesive). In various implementations, the predetermined locations may be designed to create arrangements of SiC die 6 which can then be subsequently processed in parallel through the remaining package assembly process. The schematic in FIG. 11 shows a 4-up arrangement indicating that 4 die can be processed in parallel. More or less than 4 die can be processed in various method implementations, however.

In various method implementations, the SiC die 6 may then be mounted to the heat sinks 36 using a pressure-assisted Ag sintering process like any disclosed in this document. In other implementations, any of the other die adhesive materials disclosed herein may be employed to bond the heat sink to the die. The wafer carrier 38 is then singulated to leave two or more of the SiC die 6/heat sinks 36 combined together, allowing the combined die to be processed in parallel through the rest of the packaging process. A wafer carrier grinding step is then added to the packaging process to remove the wafer carrier 38 and expose the heat sink 36.

Figure 12:
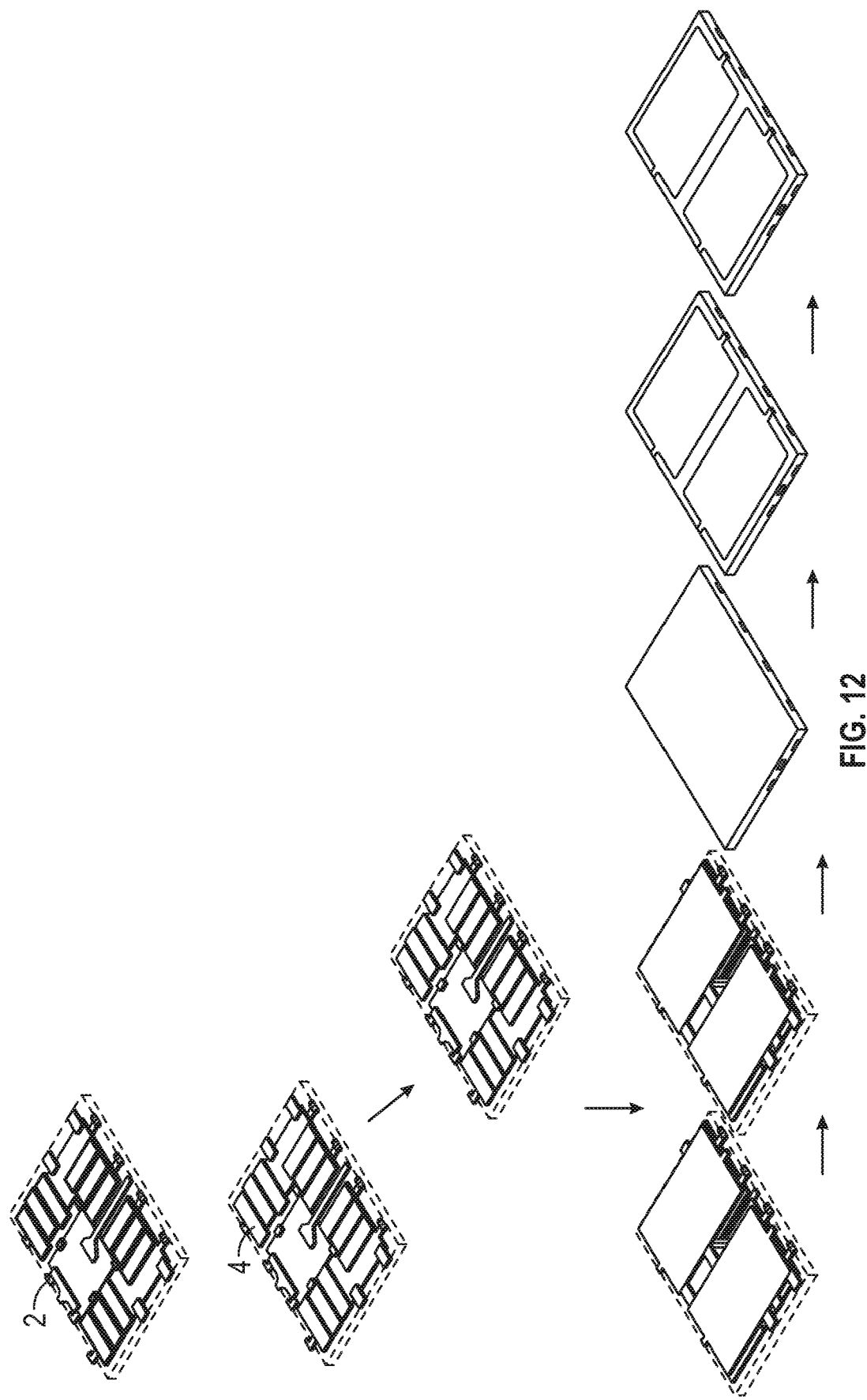
FIG. 12 illustrates an process flow of implementation of a method of forming a semiconductor package where no drain clip is used.

In various implementations where parallel processing of the SiC die is conducted using the wafer carrier material, where Ag sintering is carried out, the material of the heat sink itself can form the material of the drain contact. Where the design of the package permits, the parallel die can all share the same drain contact which doubles as a heat transfer structure. The top view of 4 parallel SiC die that share common sources and gates is illustrated on the left side of FIG. 11 following a bottom view of the same 4 die illustrating the common drain 40 formed by the heat sink material. In packages formed using the parallel processing method implementations, no drain clip 10 may be included in the structure of the package and the processing method steps that involve the drain clip 10 may accordingly be omitted. FIG. 12 illustrates an implementation of such a method indicating those steps from the process illustrated in FIG. 9 that no longer need to be performed where the clip is omitted and parallel processing using an integrated heatsink 36 is included. While a baseframe 2 is still used to form the source/drain connections, the heat sink 36 (or a metal layer formed thereon) forms the common drain 40 connection.

Figure 13:
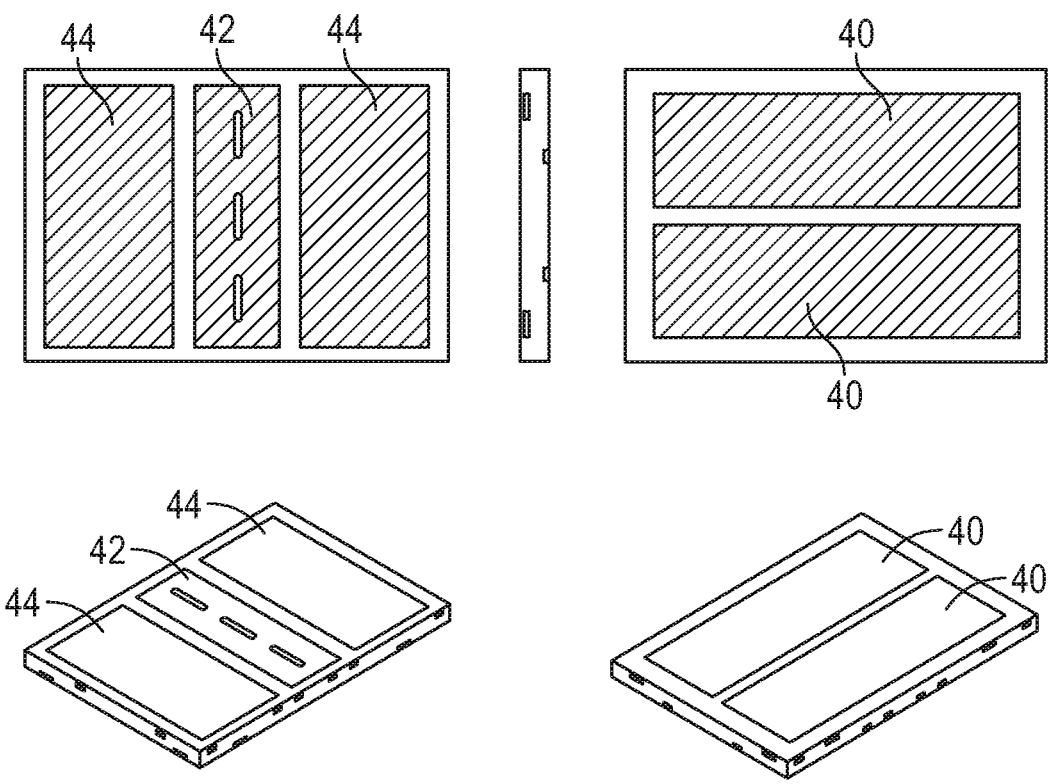
FIG. 13 illustrates various view of an alternative semiconductor package implementation.

FIG. 13 illustrates another implementation of a package formed using the principles disclosed herein demonstrating a different orientation/shape for the source 44, gate 42, and drain contacts 40 of the device. These contact designs may be employed with various SiC die using various baseframe 2 and etched clip 10 designs. A wide variety of possible source, gate, and drain contact arrangements, shapes, positions, and orientations are possible using the principles disclosed in this document. FIG. 14 includes a drawing of the internal structure of the package illustrated in FIG. 13, the cross sectional views of FIGS. 14A and 14B taken along the respective section lines showing the position of the die and the gate and source pads.

Figure 15:
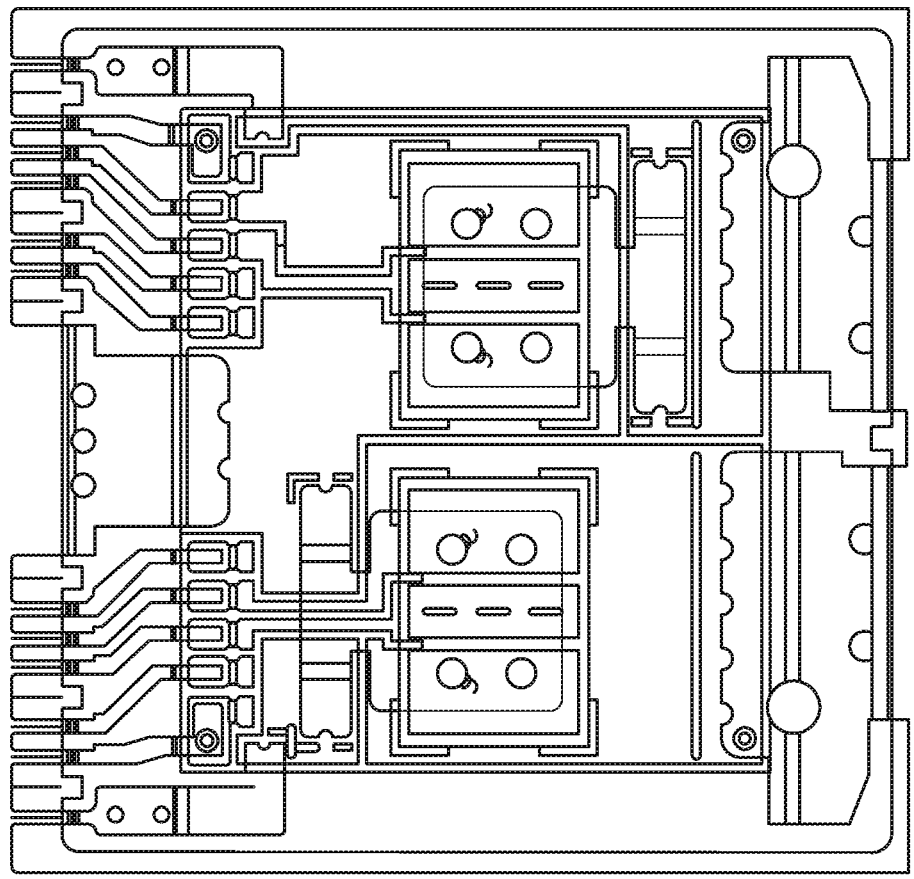
FIG. 15 illustrates a close-up view of an implementation of an automotive high power module that includes two SiC MOSFET packages therein.
Figure 15:
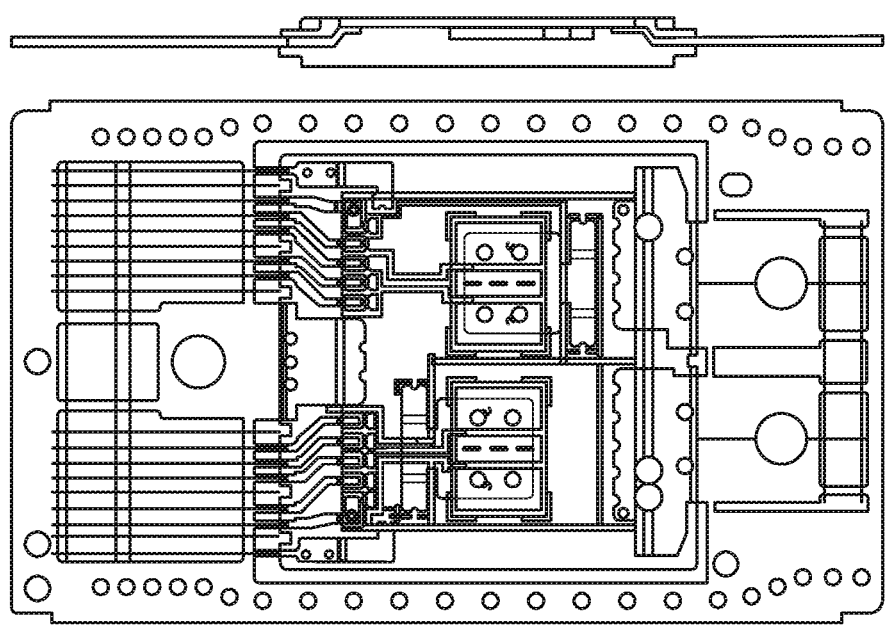

The various semiconductor packages disclosed herein may be included as components in additional semiconductor package types to permit them to be pinned out in such a way to meet the requirements of various applications. FIG. 15 illustrates full views and a close up view of an automotive high power module (AHPM) that includes two SiC MOSFET packages therein. The drawings illustrate how the various contacts on the devices are then routed to pins and contacts allowing the device to operate through contacting the gate, source, and drain regions of both packages. A wide variety of package designs can employ the packages disclosed in this document as subcomponents using the principles disclosed herein.

Figure 16:
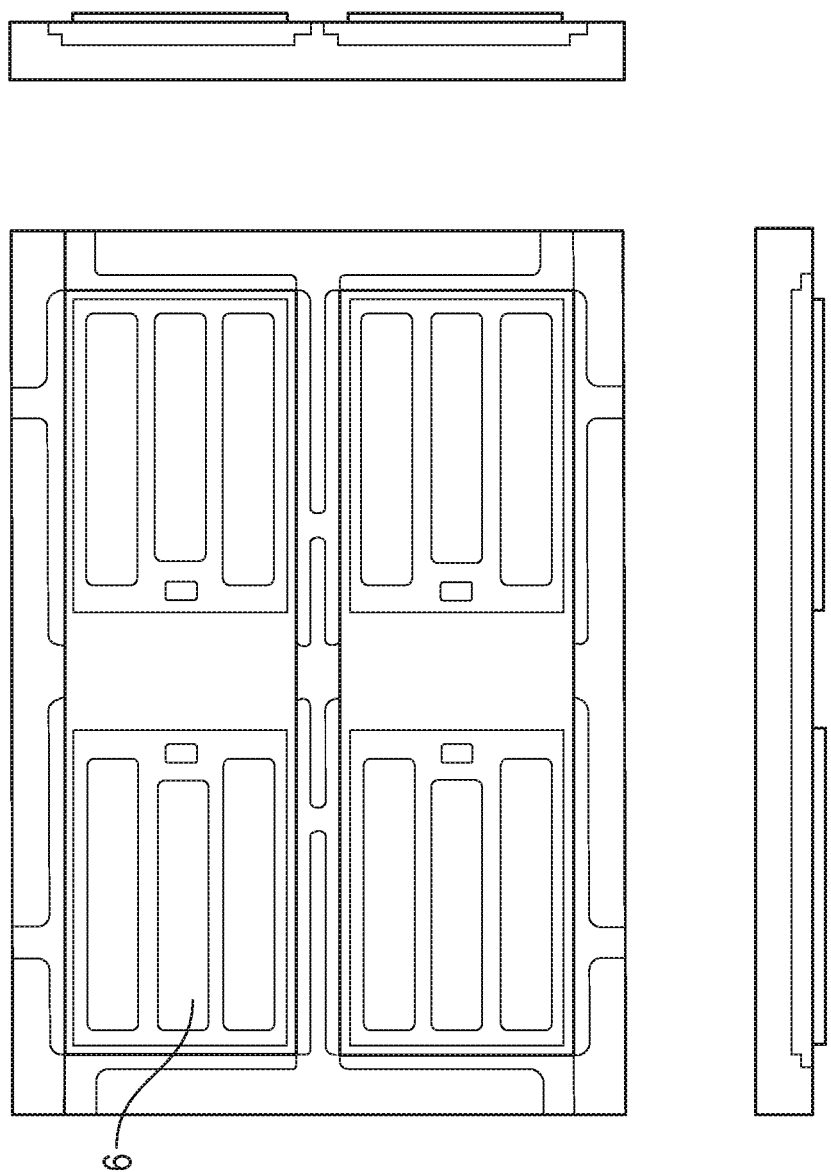
FIG. 16 illustrates an implementation of a premolded baseframe showing the placement of four die thereon and a side and end view illustrating the thickness of the mold compound on the baseframe.
Figure 17:
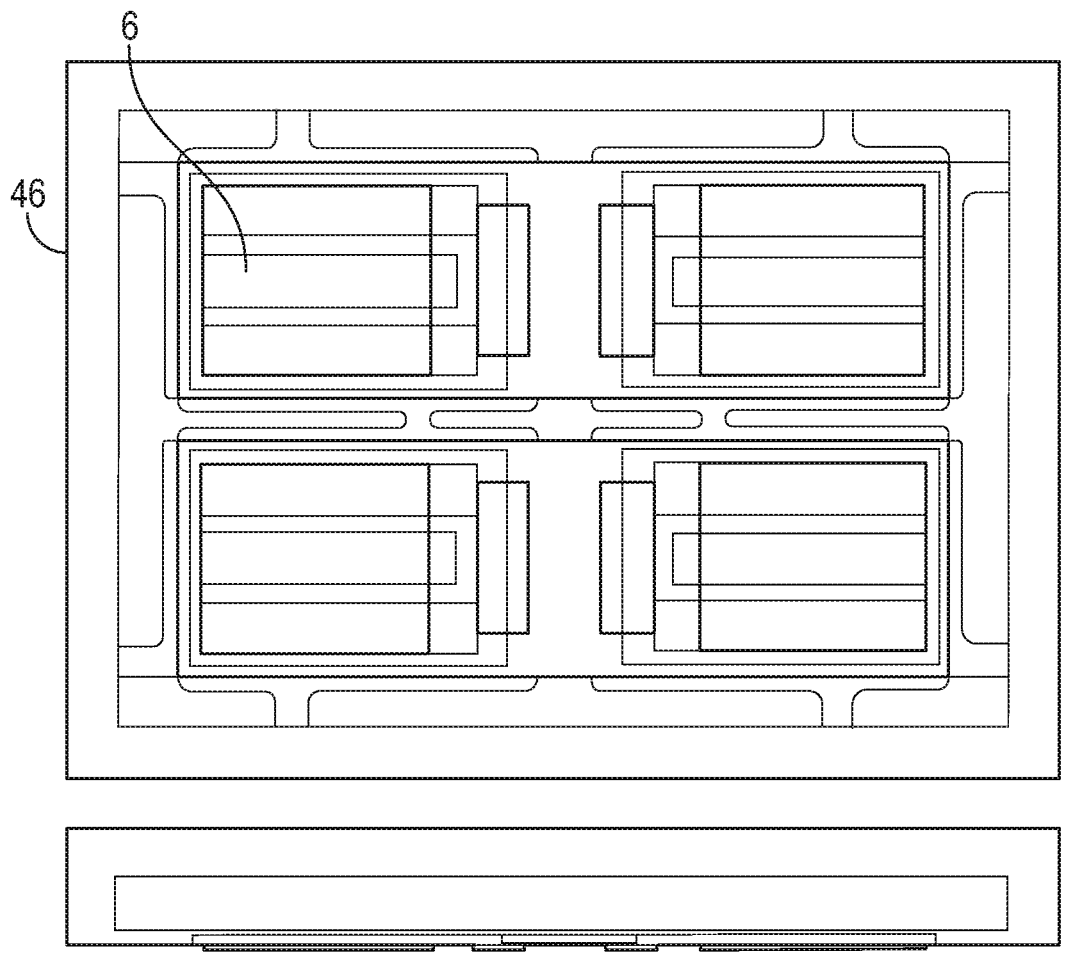
FIG. 17 illustrates the package of FIG. 16 following application of the additional mold compound.
Figure 18:
FIG. 18 illustrates an implementation of the package of FIG. 17 following grinding.

In various semiconductor package implementations, the baseframe 2 may be premolded on a first side of the baseframe 2 prior to the coupling of the SiC die onto the baseframe 2. FIG. 16 illustrates an implementation of a premolded baseframe 2 showing the placement of four die 6 thereon and a side and end view illustrating the thickness of the mold compound on the baseframe 2. Following coupling of the die with the baseframe 2 (which may be done using any technique and system disclosed in this document), the fan-out RDL layer may be applied to the baseframe 2 to form the gate and source contacts. An additional die molding step is then carried out to cover the sides of the die leaving the gate contacts and source contacts exposed. The mold compound on the side of the baseframe 2 opposite the gate and source contacts is then ground off to expose the drain contacts of the baseframe 2. FIG. 17 illustrates the package of FIG. 16 following application of the additional mold compound 46 and FIG. 18 illustrates an implementation of the package following the grinding step. This particular technique could be modified include attaching a heat sink to the die using any of the processes disclosed in this document. Ag sintering materials and pressure assisted sintering processes like those disclosed in this document could also be utilized in various method implementations.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
  a first semiconductor die coupled between a baseframe and a clip; and
  a second semiconductor die coupled between the baseframe and the clip, the baseframe comprising:
    a first gate pad of the baseframe coupled with a gate pad of the first semiconductor die;
    a second gate pad of the baseframe coupled with a gate pad of the second semiconductor die;
    a first source pad of the baseframe coupled with a source pad of the first semiconductor die; and a second source pad of the baseframe coupled with a source pad of the second semiconductor die;
wherein the first source pad of the baseframe extends towards the gate pad of the first semiconductor die beyond a perimeter of the source pad of the first semiconductor die;
wherein the second source pad of the baseframe extends towards the gate pad of the second semiconductor die beyond a perimeter of the source pad of the second semiconductor die;
wherein the gate pad of the first semiconductor die extends beyond a perimeter of the first gate pad of the baseframe;
wherein the gate pad of the second semiconductor die extends beyond a perimeter of the second gate pad of the baseframe;
wherein the first gate pad of the baseframe extends beyond a perimeter of the first semiconductor die; and
wherein the second gate pad of the baseframe extends beyond a perimeter of the second semiconductor die.

2. The package of claim 1, further comprising an Ag sinter layer coupled between the first semiconductor die, the clip and the baseframe.

3. The package of claim 1, wherein the clip comprises a drain pad, the clip configured to couple with a drain pad of the first semiconductor die.

4. The package of claim 1, further comprising a mold compound enclosing the first semiconductor die on four sides of the first semiconductor die and enclosing the second semiconductor die on four sides of the second semiconductor die.

5. The package of claim 1, further comprising a redistribution layer between the gate pad of the first semiconductor die and the first gate pad of the baseframe.

6. The package of claim 1, further comprising a heat sink coupled directly to the first semiconductor die through a die adhesive material.

7. The package of claim 1, wherein the package is configured to provide electrical isolation between a termination ring of the first semiconductor die and the source pad of the first semiconductor die over an operating voltage range of 400 V to 1700 V.

8. The semiconductor package of claim 1, wherein the first semiconductor die and the second semiconductor die lie in the same plane.

9. The semiconductor package of claim 1, wherein the gate pad of the first semiconductor die faces the gate pad of the second semiconductor die.

10. The semiconductor package of claim 1, further comprising a third die and a fourth die coupled between the clip and the baseframe.

11. The semiconductor package of claim 1, wherein the first source pad of the baseframe extends over a perimeter of the gate pad of the first semiconductor die.

12. A semiconductor package comprising:
a plurality of semiconductor die coupled between a baseframe and a heat sink, the baseframe comprising:
a gate pad of the baseframe coupled with a gate pad of the plurality of semiconductor die; and
a source pad of the baseframe coupled with a source pad of the plurality of semiconductor die;
wherein a surface of the gate pad of the baseframe facing the plurality of semiconductor die lies in the same plane as a surface of the source pad of the baseframe facing the plurality of semiconductor die;
wherein the source pad of the baseframe extends towards the gate pad of the plurality of semiconductor die beyond a perimeter of the source pad of the plurality of semiconductor die; and
wherein the gate pad of the baseframe extends beyond a perimeter of a corresponding semiconductor die of the plurality of semiconductor die.

13. The package of claim 12, further comprising an Ag sinter layer coupled between the plurality of semiconductor die, the heat sink, and the baseframe.

14. The package of claim 12, wherein the heat sink comprises a drain pad, the heat sink configured to couple with a drain pad of the plurality of semiconductor die.

15. The package of claim 12, further comprising a mold compound enclosing the plurality of semiconductor die on four sides of each die of the plurality of semiconductor die.

16. The package of claim 12, further comprising a redistribution layer between the gate pad of the plurality of semiconductor die and the gate pad of the baseframe.

17. The semiconductor package of claim 12, wherein each semiconductor die of the plurality of semiconductor die includes a gate pad facing the gate pad of an adjacent semiconductor die of the plurality of semiconductor die.

18. A semiconductor package comprising:
a first semiconductor die coupled between a baseframe and a clip;
a second semiconductor die coupled between the baseframe and the clip, the baseframe comprising:
a first gate pad of the baseframe coupled with a gate pad of the first semiconductor die;
a second gate pad of the baseframe coupled with a gate pad of the second semiconductor die;
a first source pad of the baseframe coupled with a source pad of the first semiconductor die; and
a second source pad of the baseframe coupled with a source pad of the second semiconductor die; and
wherein the gate pad of the first semiconductor die and the gate pad of the second semiconductor die are coupled between the source pad of first semiconductor die and the source pad of the second semiconductor die;
wherein the first gate pad of the baseframe extends beyond a perimeter of the first semiconductor die; and
wherein the second gate pad of the baseframe extends beyond a perimeter of the second semiconductor die.

19. The semiconductor package of claim 18, further comprising a second baseframe and a second clip, wherein a third die and a fourth die are coupled between the second baseframe and the second clip.

20. The semiconductor package of claim 18, wherein the first gate pad of the baseframe only partially covers the gate pad of the first semiconductor die and wherein the second gate pad of the baseframe only partially covers the gate pad of the second semiconductor die.

* * * * *